United States Patent [19]

Jeong et al.

[11] Patent Number: 5,898,226
[45] Date of Patent: Apr. 27, 1999

[54] SEMICONDUCTOR CHIP HAVING A BONDING WINDOW SMALLER THAN A WIRE BALL

[75] Inventors: Ki-Kwon Jeong; Hyeong-Seob Kim, both of Kyungki-do, Rep. of Korea

[73] Assignee: Samsung Electronics Co., Ltd., Suwon, Rep. of Korea

[21] Appl. No.: 08/770,248

[22] Filed: Dec. 20, 1996

[30] Foreign Application Priority Data

Dec. 30, 1995 [KR] Rep. of Korea ................ 95-68162

[51] Int. Cl.⁶ .................. H01L 21/316; H01L 21/60; H01L 21/321
[52] U.S. Cl. .................. 257/786; 257/781; 257/784; 257/751; 257/737
[58] Field of Search .................... 257/786, 781, 257/751, 784, 737

[56] References Cited

U.S. PATENT DOCUMENTS 4,733,289  3/1988  Tsurumaru ........................ 357/54
5,430,329  7/1995  Harada et al. ..................... 257/788
5,665,996  9/1997  Williams et al. .................. 257/784

FOREIGN PATENT DOCUMENTS 01241832  9/1989  Japan ................................ 257/788
02281743  11/1990  Japan ................................. 357/65
 0184340  8/1991  Japan ................................. 357/65

Primary Examiner—Peter Toby Brown
Assistant Examiner—Hung Van Duong
Attorney, Agent, or Firm—Jones, Volentine, Steinberg & Whitt, L.L.P.

[57]     ABSTRACT

A semiconductor chip is provided comprising a semiconductor substrate having determined circuit elements on it, a surface-smoothing layer deposited on the substrate, a bonding pad formed on the smoothing layer and connected electrically to the circuit elements, a passivation layer formed on the surface-smoothing layer, the passivation layer having a window for exposing a part of the bonding pad, and a second metal layer having a same height as the passivation layer and occupying peripheral parts of the window to form a reduced bonding windows for the bonding pad.

11 Claims, 4 Drawing Sheets

SEMICONDUCTOR CHIP HAVING A BONDING WINDOW SMALLER THAN A WIRE BALL

BACKGROUND OF THE INVENTION

The present invention relates generally to a semiconductor chip and a wire bonding method for a semiconductor chip. More particularly, the present invention relates to a semiconductor chip comprising a bonding window that is formed on a bonding pad and has a smaller size than that of a wire ball. This can prevent the bonding pad from being degraded by corrosion during reliability tests and during a manufacturing process of the chip. The present invention also relates to a wire bonding method for making the semiconductor chip described above.

The wire bonding process is one method for connecting a semiconductor chip to inner leads of the lead frame or to wirings of a circuit board. Bonding pads of the semiconductor chip are connected to the lead frame or to the circuit board by gold or aluminum wires having a diameter of about 0.8–1.5 $\mu$m.

The conditions of the bonding process and the equipment required for such a process vary depending on the wire material used. When using a gold wire or an aluminum wire, however, the wire is generally supplied to a bonding head by a wire spool and the bonding of the wire is performed by this bonding head. When the bonding head is aligned above the bonding pad of the semiconductor chip, the wire is attached onto the bonding pad by one of: a thermo-compression bonding method carried out under high temperature and high pressure; an ultrasonic bonding method applying a vibration under high pressure; or a thermosonic bonding method applying a vibration under high temperature and high pressure.

In a wire bonding method using a gold wire, the wire is attached by the ball bonding process using a bonding head which comprises a capillary having a fine passage. The wire is supplied through the passage of the capillary and forms a ball by having a high voltage applied to its end. The ball of melted wire is then pressed onto the bonding pad to attach the wire to the bonding pad.

FIG. 1 is a schematic sectional view showing a bonding of a wire on a bonding pad of a semiconductor chip by ball bonding process using a gold wire. Initially, certain circuit elements (not shown) are formed on the semiconductor substrate 1. This substrate generally comprises silicon. A surface-smoothing layer 2 such as boron phosphorous silica glass (BPSG) is then formed over the substrate 1. Next, a bonding pad 3 for the semiconductor chip is formed on the surface-smoothing layer 2 by depositing a metal such as aluminum over the smoothing layer 2. The circuit elements on the semiconductor substrate 1 are connected to external equipment through the bonding pad 3. After forming the bonding pad 3, the whole surface of the semiconductor chip is covered with passivation layer 4 such as silicon nitride ($Si_3N_4$). Then, a bonding window with a width of $W_1$ is formed in the passivation layer 4. The chip is then subjected to a high temperature to cause the formation of an oxide layer 5 over the bonding pad 3. This oxide layer 5 results from the reaction of the metal in the bonding pad 3 with air at a high temperature. The wire ball 6 formed at the end of the wire 7 is then pressed by the capillary 8 onto the bonding pad 3 through the bonding window.

The conventional wire bonding method has some drawbacks, however. First, since the bonding window is larger than the wire ball 6, the capillary 8 may impact on the bonding pad 3 during a ball bonding process while pressing the wire ball 6. This impact can break the oxide layer 5 covering the bonding pad 3, thus exposing the surface of the bonding pad 3 not covered with the wire ball, which can cause the surface to become corroded.

In particular, after the completion of packaging, the bonding pad in the conventional device tends to be corroded and degraded during standard reliability tests such as PCT (Pressure Cooker Test) or T/C (Temperature Cycling). This is especially true with the PCT, which generally takes place in a pressure cooker at 100% humidity and at a temperature of about 121° C. A more detailed description of PCT and T/C can be found in MIL standard MIL-STD-883D, test method 1010.7, JEDEC standard No. 22-B, test method A102-A, and JEDEC standard No. 22-B, test method A104, all of which are herein incorporated by reference.

Second, although it is desirable to reduce the designed chip in order to reduce the size of the whole semiconductor device, this conventional method has a limitation in reducing the size of the semiconductor device since the conventional wire bonding process can be performed only under the condition that the bonding window has 90×90 $\mu m^2$ or more of dimension.

SUMMARY OF THE INVENTION

Thus, the present invention is provided in order to overcome the drawbacks associated with the conventional semiconductor packages as described above.

An object of the invention is to provide a semiconductor chip, which permits a significant prevention of the degradation caused by corrosion of the bonding pad during reliability tests of the semiconductor chip package.

The another object of the present invention is to reduce the size of semiconductor chips by increasing the shrinkage ratio of the semiconductor device.

These objects can be accomplished by a semiconductor chip comprising a semiconductor substrate including circuit elements; a surface-smoothing layer formed over the substrate; a bonding pad formed over the smoothing layer and connected electrically to the circuit elements; a passivation layer formed over the surface-smoothing layer, the passivation layer having a bonding window for exposing the bonding pad; and a second metal layer having the same height as the passivation layer and occupying peripheral parts of the bonding window to define a reduced bonding window.

Preferably, a size of the reduced bonding window is smaller than that of a wire ball to be attached to the bonding pad during a wire bonding process. The bonding window preferably has a circular shape or a rectangular shape, and the second metal layer is preferably less corrosive than the bonding pad.

These objects may also be accomplished by a process for manufacturing a semiconductor chip comprising the steps of: forming circuit elements on a semiconductor substrate; depositing a surface-smoothing layer over the substrate; forming a bonding pad over the surface-smoothing layer; depositing a passivation layer over the surface-smoothing layer and the bonding pad; forming a bonding window to expose the bonding pad by etching the passivation layer; depositing a second metal layer over the passivation layer; and forming a reduced bonding window by etching the second metal layer so that the only a portion of the second metal layer is left, on the periphery of the bonding window and in contact with the passivation layer.

In this process, the size of the reduced bonding window is preferably smaller than that of a wire ball to be attached to the bonding pad during a wire bonding process. The step of forming bonding windows may further comprise the steps of: coating the second metal layer with a photoresist layer; exposing and developing the photoresist layer with a photomask having a same pattern as the bonding windows; and etching the second metal layer perpendicularly by a certain depth by radiating reactive ions. The bonding pads preferably comprise aluminum. Furthermore, the second metal layer is preferably less corrosive than aluminum.

These objects may also be accomplished by a method for bonding a wire on a bonding pad of a semiconductor chip, which comprises a semiconductor substrate, a bonding pad formed over the substrate, and a protective layer formed over the substrate with a bonding window to expose a part of the bonding pad, characterized in that the method comprises the steps of: forming a wire ball larger than the bonding window at the end of the wire; positioning the wire ball on the bonding window of the bonding pad; and pressing and heating the wire ball to bond the wire ball onto the bonding pad.

The wire ball is preferably formed by applying a high voltage to the end of the wire. The exposed surface of the bonding pad is preferably covered entirely with the wire ball. The wire ball bonded onto the bonding pad is preferably in contact with a part of the protective layer. The bonding window preferably has either a circular shape or a rectangular shape. The protective layer is preferably formed by reactive ion etching a second metal layer deposited over a passivation layer covering the semiconductor chip. The protective layer is preferably less corrosive than the bonding pad.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and in which.

DETAILED DESCRIPTION OF A PREFERRED EMBODIMENT OF THE INVENTION

The present invention will now be described in more detail with reference to accompanying drawings.

FIGS. 2A through 2D are schematic views showing steps for forming the bonding pad according to a first preferred embodiment of the present invention. In the device shown in FIG. 2A, circuit elements such as memory cells, NAND gates, or NOR gates (not shown) are initially formed on the semiconductor substrate 10. Following the formation of these circuit elements, a surface-smoothing layer 12 such as BPSG is deposited over the substrate 10. This smoothing layer 12 provides an even surface that prevents the later-deposited metal lines from shorting out or undergoing electro-migration.

Metallization then follows to form input or output terminals to connect the circuit elements to external equipment. During the metallization step, wirings and the bonding pad 14 are formed, which will themselves be connected to the circuit board or to the leads of the lead frame. The bonding pad 14 deposited over the smoothing layer is preferably aluminum.

Figure 1:
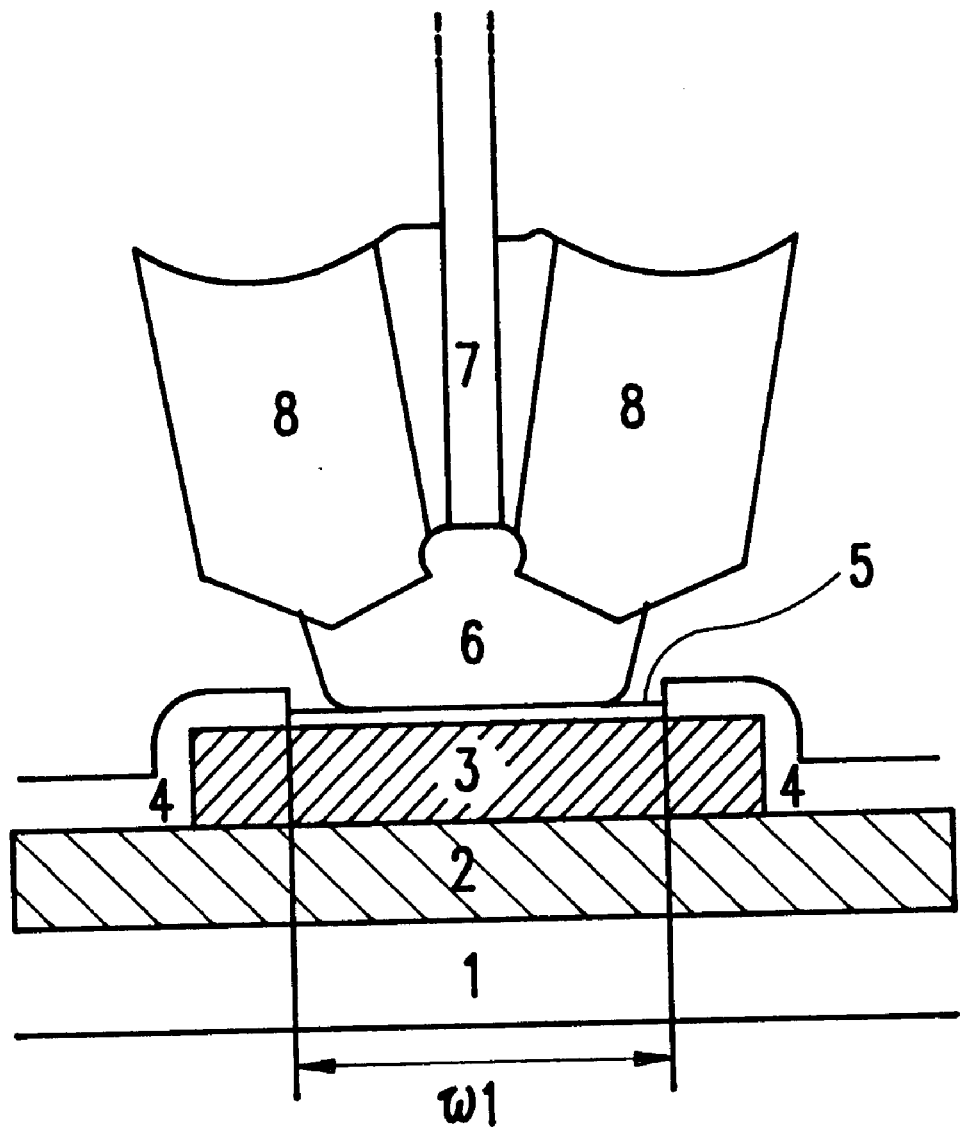
FIG. 1 is a schematic sectional view showing a bonding of a wire on a bonding pad of a semiconductor chip using a conventional ball bonding process.
Figure 2A:
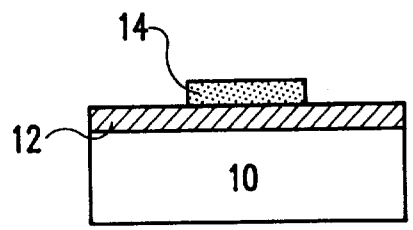
FIGS. 2A, 2B, 2C and 2D are schematic views showing steps for forming the bonding pad according to a first preferred embodiment of the present invention.
Figure 2B:
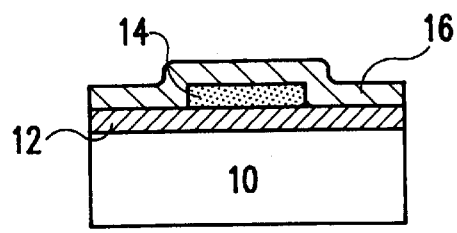

As shown in FIG. 2B, after performing metallization, the whole surface of the semiconductor chip is then covered with a passivation layer 16. The passivation layer 16 serves to protect the surface of the semiconductor chip from impurities such as dust and moisture after wafer processing. The passivation layer 16 is preferably made of an inert insulating material such as silicon nitride. Because it acts as an insulator, a bonding window must be formed in the passivation layer 16 to connect the bonding pad 14 to the lead frame or the circuit board.

Figure 2C:
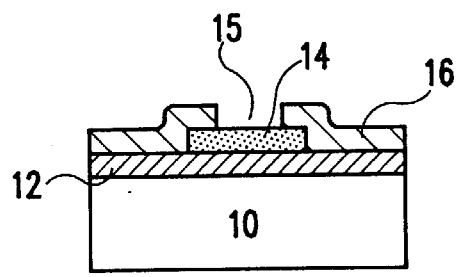

The bonding window 15 is formed, as shown in FIG. 2C, preferably by photo-etching the passivation layer 16. The size of the bonding window 15 is preferably about the same as that of the conventional bonding window, $W_1$.

Figure 2D:
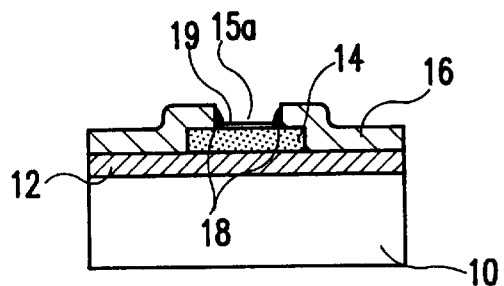

After the bonding window 15 is formed, a second metal layer 18 is deposited over the whole surface of the semiconductor chip covered with the passivation layer 16. The second metal layer 18 is then etched, preferably by a Reactive Ion Etching (RIE) process, so that only the part of the second metal layer 18 in contact with the passivation layer 16 and formed along the inner periphery of the bonding window 15 remains, as shown in FIG. 2D. The portion of the second metal layer 18 that remains has the same height as the passivation layer 16 and occupies an inner periphery of the bonding window 15. In this way, the second metal layer 18 defines a reduced bonding window 15a for the bonding pad 14.

After the formation of the second metal layer 18, the chip is subjected to a high temperature and an oxide layer 19 is formed over the bonding pad 14. This oxide layer 19 serves to protect the bonding pad 14 from corrosion or degradation during testing or operation.

In detail, the reduced bonding window 15a is initially formed by coating the second metal layer 18 with a photoresist layer, and exposing and developing the photoresist layer with a photomask having a determined pattern. The second metal layer 18 is then etched perpendicularly to a certain depth by radiating reactive ions. In this way, the reduced bonding window 15a becomes smaller than a conventional bonding window $W_1$ by the region occupied by the second metal layer 18.

In addition to reducing the size of the exposed portion of the bonding pad 14, the second metal layer 18 is sturdier and less corrosive than the bonding pad 14, and so prevents the bonding pad 14 from being corroded and degraded during reliability tests. Thus, in the first embodiment of the present invention, the protective layer of the bonding pads comprises the second metal layer 18 together with the passivation layer 16.

Figure 3B:
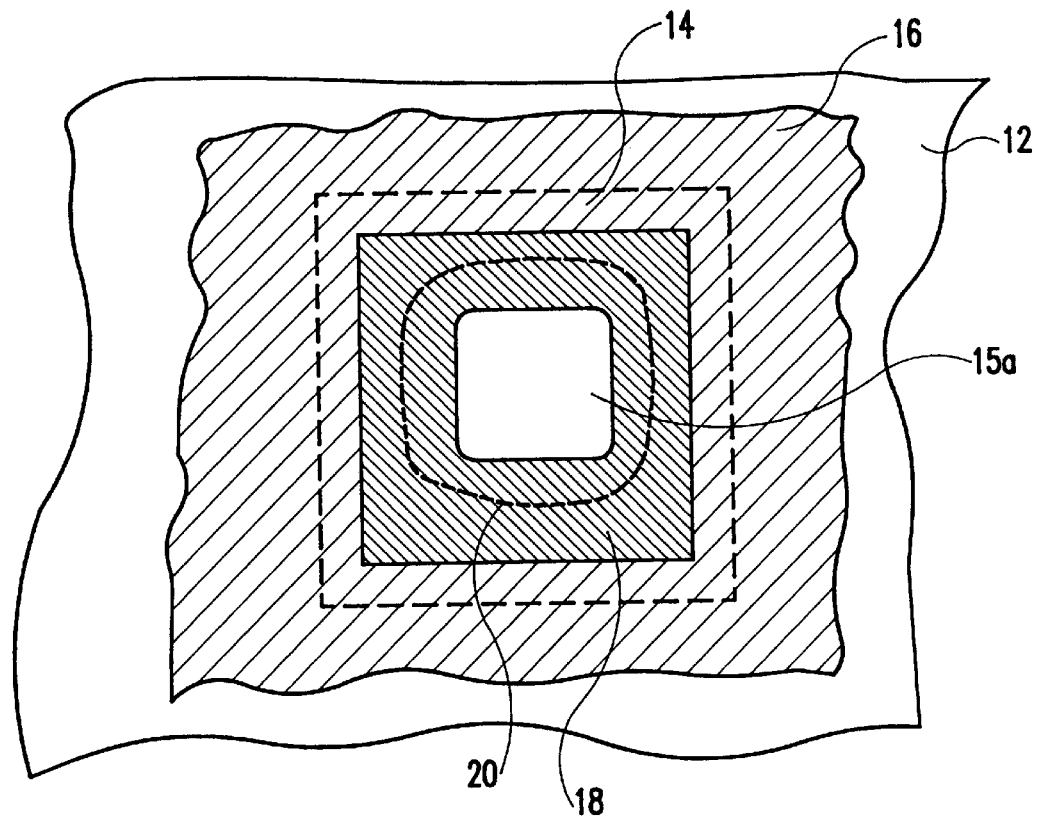
FIG. 3B is a schematic view showing the attachment of a wire ball onto a bonding pad having a bonding window according to the first preferred embodiment of the present invention.
Figure 3A:
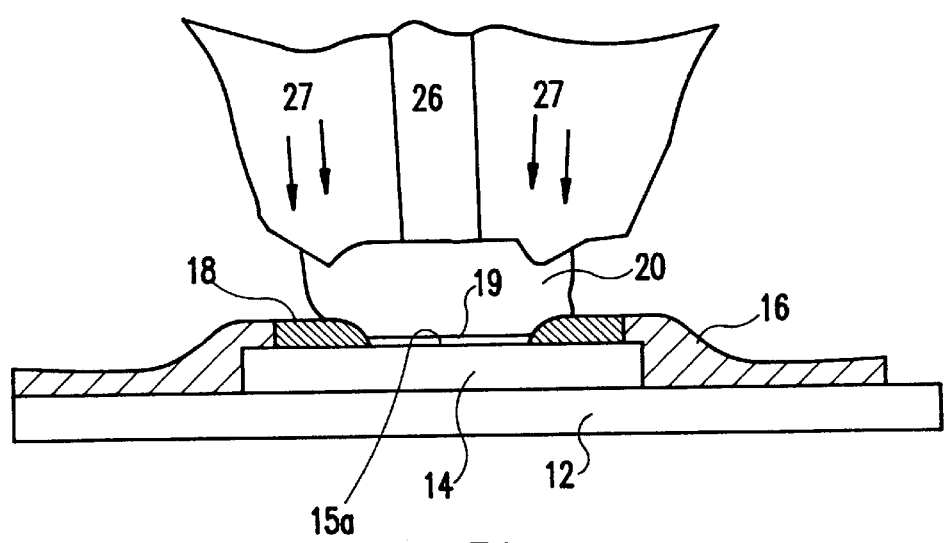
FIG. 3A is a plan view showing relative sizes of the bonding window, the bonding pad, and the wire ball, according to first preferred embodiment of the present invention.

FIG. 3A is a schematic view showing the attachment of a wire ball onto a bonding pad having a bonding window according to the first embodiment of the present invention. The wire ball 20 is formed at the end of the wire 26 passed through the capillary 27, and then is heated on the bonding pad 14. The circular-shaped wire ball 20 is preferably attached on the bonding pad 14 by pushing the capillary 27 in the direction of the arrows until it comes in contact with the second metal layer 18. Since the second metal layer 18 is stronger than the oxide layer 19, it is not damaged by the impact of the capillary 27.

The second metal layer 18 protects the bonding pad 14 from corrosion during reliability tests such as PCT. Even if the oxidation layer 19 formed on the bonding pad after metallization is broken by the impact of the capillary 27, the entirety of the bonding pad is covered by either the wire ball 20 or the second metal layer 18. Unlike the conventional method, no part of the bonding pad in this embodiment of the present invention is exposed to outside conditions.

FIG. 3B is a plan view showing relative sizes of the bonding window, the bonding pad, and the wire ball, according to the first embodiment of the present invention. As can be seen from FIG. 3B, the second metal layer 18 is deposited inside the boundaries of the bonding window 15 defined by the passivation layer 16. The reduced bonding window 15a created by the second metal layer 18 has a smaller size than the wire ball 20 that is attached onto the bonding pad 14.

Figure 4A:
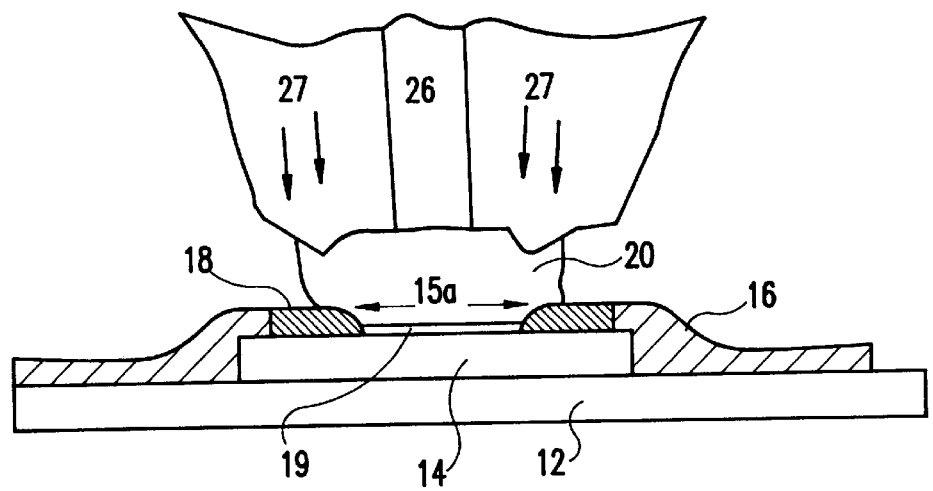
FIG. 4A is a plan view showing a second preferred embodiment of the present invention, wherein the bonding window has a circular shape.
Figure 4B:
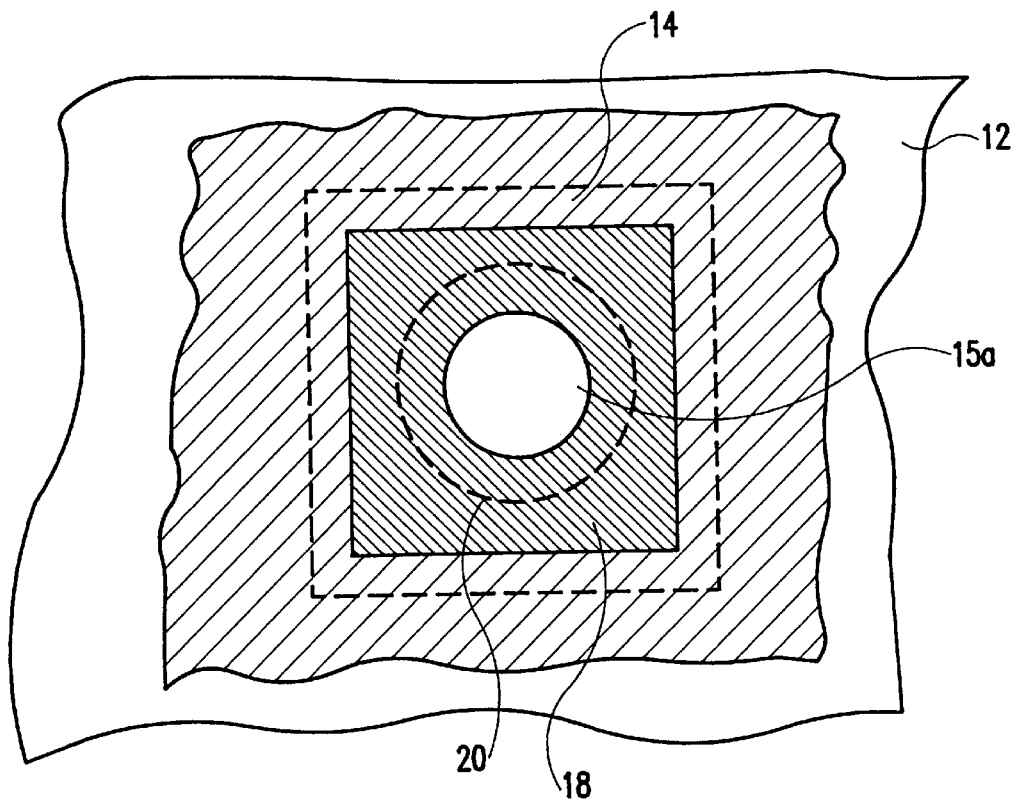
FIG. 4B is a schematic view showing the attachment of a wire ball onto a bonding pad having the bonding window of FIG. 4A.

FIG. 4A is a schematic view showing the attachment of a wire ball onto a bonding pad according to a second preferred embodiment of the present invention. FIG. 4B is a plan view showing relative sizes of the bonding window, the bonding pad, and the wire ball, according to the second embodiment of the present invention.

The second preferred embodiment is similar to the first preferred embodiment shown in FIGS. 3A and 3B, except for the shape of the reduced bonding window 15a. The method of fabricating the device according to the second preferred embodiment is essentially the same as shown in FIGS. 2A to 2D for the first preferred embodiment, except as described below.

As noted above, in the second embodiment the reduced bonding window 15a has a circular shape rather than the rectangular shape used in the first preferred embodiment. The circular-shaped reduced bonding window 15b can be formed by photo-etching the second metal layer 18, using a photomask with circular patterns. In this case, when the wire ball 20 comes in contact with the second metal layer 18, the contact surface is uniform. This results in a more stable bonding state.

In order to investigate the degradation of the device caused by corrosion during PCT, a corrosion test was performed before and after a wire bonding process for conventional chips some of which were bare and some of which included a passivation layer 16. The result was that a chip-coated device, i.e., one with a passivation layer 16, was less subject to corrosion before wire bonding than a bare device. This results from the fact that a thicker oxide layer 19 is formed on the bonding pad 14 during the curing process in high temperature after chip-coating. In contrast, after wire bonding the corrosions of both devices were almost the same. This results from the fact that the oxide layer 19 formed on the bonding pad 14 is broken by the impact caused by the capillary 27 during the wire bonding process. To demonstrate this result, the devices were cured in an oven after performing wire bonding process to reform the oxide layer 19. As a result, the corrosions of the devices were almost same as those of the devices before they were subjected to a wire bonding process. This results from the fact that the oxide layer 19 is reformed during the curing process.

The present invention is based on this fact. According to the first preferred embodiment of the present invention, a reduced bonding window 15a exposing a portion of the bonding pad 14 is formed to have a smaller size than that of the wire ball 20. Furthermore, the pressing force of the capillary 27 is applied to the second metal layer 18 at the periphery of the bonding window 15, in order to prevent the oxide layer 19 from being broken during wire bonding process. Consequently, the oxide layer 19 over the bonding pad 14 is not broken during the wire bonding process, and so it can serve to protect the device from degradation caused by corrosion during reliability tests.

In addition, under current examination criterion of wire bonding, if the wire ball deviates from the bonding window, it is regarded as defective. To account for this, the bonding window is generally made larger than the wire ball. However, a wire pull test revealed that with a bonding window of size having 100×100 $\mu m^2$, even when the wire ball deviated by about 50% from the bonding window 15, the bonding strength was acceptable. Therefore, according to the first preferred embodiment of the present invention, the size of the bonding window is set at about 50×50 $\mu m^2$.

As obvious from the description above, a semiconductor chip constructed according to the present invention comprises a bonding window that is smaller than the wire ball. This protects the bonding pad of the semiconductor chip from corrosion during reliability tests such as PCT because the bonding pad itself is never exposed after the wire bonding process.

The present invention is not limited to the above-described embodiments. Various changes and modifications may be effected by one having an ordinary skill in the art and remain within the scope of the invention, as defined by the appended claims.

What is claimed is:

1. A semiconductor chip comprising
   a semiconductor substrate including circuit elements;
   a surface-smoothing layer formed over the substrate;
   a bonding pad formed over the smoothing layer and connected electrically to the circuit elements;
   a passivation layer formed over the surface-smoothing layer, the passivation layer having a bonding window for exposing the bonding pad; and
   a second metal layer having the same height as the passivation layer and occupying peripheral parts of the bonding window to define a reduced bonding window.

2. A semiconductor chip as recited in claim 1, wherein a size of the reduced bonding window is smaller than that of a wire ball to be attached to the bonding pad during a wire bonding process.

3. A semiconductor chip as recited in claim 1, wherein the bonding window has a circular shape.

4. A semiconductor chip as recited in claim 1, wherein the bonding window has a rectangular shape.

5. A semiconductor chip as recited in claim 1, wherein the second metal layer is less corrosive than the bonding pad.

6. A semiconductor chip comprising
   a semiconductor substrate including circuit elements;
   a surface-smoothing layer formed over the substrate;
   a plurality of bonding pads formed over the smoothing layer and connected electrically to the circuit elements;
   a passivation layer formed over the surface-smoothing layer, the passivation layer having a plurality of bonding windows for exposing the plurality of bonding pads; and a second metal layer having the same height as the passivation layer and occupying peripheral parts of the plurality of bonding windows to define a plurality of reduced bonding windows.

7. A semiconductor chip as recited in claim 6, wherein a size of the plurality of bonding windows is smaller than that of a plurality of wire ball to be attached to the bonding pads during a wire bonding process.

8. A semiconductor chip as recited in claim 6, wherein the plurality of bonding windows have a circular shape.

9. A semiconductor chip as recited in claim 6, wherein the plurality of bonding windows have a rectangular shape.

10. A semiconductor chip as recited in claim 6, wherein the plurality of bonding windows have either a circular shape or a rectangular shape.

11. A semiconductor chip as recited in claim 6, wherein the second metal layer is less corrosive than the bonding pad.

* * * * *